US012235669B2

(12) United States Patent
Kim et al.

(10) Patent No.: US 12,235,669 B2
(45) Date of Patent: Feb. 25, 2025

(54) ELECTRONIC PEDAL DEVICE (71) Applicants: Hyundai Motor Company, Seoul (KR); Kia Corporation, Seoul (KR); DONG HEE INDUSTRIAL CO., LTD., Ulsan (KR)

(72) Inventors: Eun Sik Kim, Gwangmyeong-Si (KR); Wi Sang Park, Hwaseong-Si (KR); Jae Hyun Cho, Suwon-Si (KR); Jung Min Lee, Busan (KR); Seong Ju Jo, Seoul (KR)

(73) Assignees: Hyundai Motor Company, Seoul (KR); Kia Corporation, Seoul (KR); DONG HEE INDUSTRIAL CO., LTD., Ulsan (KR)

( * ) Notice: Subject to any disclaimer, the term of this patent is extended or adjusted under 35 U.S.C. 154(b) by 0 days.

(21) Appl. No.: 18/220,094

(22) Filed: Jul. 10, 2023

(65) Prior Publication Data
US 2024/0192719 A1 Jun. 13, 2024

(30) Foreign Application Priority Data

Dec. 7, 2022 (KR) .................. 10-2022-0170004

(51) Int. Cl.
| G05G 1/01 | (2008.04) |
| B60K 26/02 | (2006.01) |
| B60T 7/04 | (2006.01) |
| B60T 7/06 | (2006.01) |
| G05G 1/38 | (2008.04) |
| G05G 5/03 | (2008.04) |
| H05K 7/14 | (2006.01) |

(52) U.S. Cl.
CPC ............. *G05G 1/01* (2013.01); *B60K 26/021* (2013.01); *B60T 7/042* (2013.01); *B60T 7/06* (2013.01); *G05G 1/38* (2013.01); *G05G 5/03* (2013.01); *H05K 7/1427* (2013.01); *B60K 2026/023* (2013.01); *G05G 2505/00* (2013.01)

(58) Field of Classification Search
CPC ..................... B60K 2026/023; G05G 1/01
See application file for complete search history.

(56) References Cited

U.S. PATENT DOCUMENTS

| 10,946,741 B1* | 3/2021 | Kim ......................... B60T 7/06 |
| 2009/0043467 A1 | 2/2009 | Filev et al. |
| 2016/0159216 A1 | 6/2016 | Konigorski et al. |
| 2020/0183443 A1* | 6/2020 | Kim ....................... B60K 26/04 |

FOREIGN PATENT DOCUMENTS

| CN | 211223386 U | 8/2020 |
| JP | 2008-279795 | 11/2008 |
| KR | 10-1869340 | 6/2018 |
| KR | 10-2020-0070946 | 6/2020 |
| WO | WO2016/158508 | 10/2016 |

* cited by examiner

*Primary Examiner* — Vicky A Johnson
(74) *Attorney, Agent, or Firm* — Morgan, Lewis & Bockius LLP (57) ABSTRACT

An electronic pedal device includes an accelerator pedal module and a brake pedal module that operate in a pressure operation manner, whereby a driver may operate the same with a small force. The driver may easily recognize the operational state of the pedal based on a haptic signal generated during operation of the pedal. Because operation of the pedal is detected through a dual detecting structure using a Hall sensor and a pressure sensor, safety may be further ensured during operation of the pedal.

20 Claims, 6 Drawing Sheets

ELECTRONIC PEDAL DEVICE

CROSS-REFERENCE TO RELATED APPLICATION

The present application claims priority to Korean Patent Application No. 10-2022-0170004, filed on Dec. 7, 2022, the entire contents of which is incorporated herein for all purposes by this reference.

BACKGROUND OF THE PRESENT DISCLOSURE

Field of the Present Disclosure

The present disclosure relates to an electronic pedal device mounted in a vehicle to generate an acceleration signal or a braking signal in response to manipulation by a driver.

Description of Related Art

An autonomous vehicle is a smart vehicle employing autonomous driving technology by which the vehicle is capable of autonomously travelling to a set destination by itself without manipulation of the steering wheel, the accelerator, the brake, or the like by a driver.

When an autonomous driving situation is realized, a driver may select an autonomous driving mode, in which the vehicle travels autonomously to a destination without the necessity for the driver to manually drive the vehicle.

In the autonomous driving mode, a driver may desire to take a rest comfortably while stretching out his or her legs. In the instant case, when pedals (an accelerator pedal and a brake pedal) located in the space below the driver's seat remain exposed to the passenger compartment space of the vehicle, they may disturb the driver. Alternatively, there is a risk of the occurrence of an accident caused by undesired operation of the pedal.

To solve the present problem, a foldable pedal device has been developed. In the manual driving mode in which the driver manually drives a vehicle, the foldable pedal device exposes a pedal pad to the driver so that the driver can operate the pedal pad, and in the autonomous driving mode, the foldable pedal device blocks exposure of the pedal pad so that the pedal pad is not operated by the driver, ensuring comfortable rest for the driver and preventing undesirable operation of the pedal pad, thus ensuring safety.

However, the foldable pedal device has disadvantages in that a space for hiding the pedal device in a hidden state is necessary and the operation mechanism thereof is complicated.

As an alternative thereto, a pressure-operation-type pedal device has been developed.

The pressure-operation-type pedal device has advantages in that the operational displacement of the pedal is very small, the operation mechanism thereof is simple, and a mechanical configuration related to folding/unfolding operation is not necessary. Therefore, the pressure-operation-type pedal device may greatly increase the efficiency of use of the indoor space of an autonomous vehicle.

However, because the operational displacement of the pedal is very small, the pressure-operation-type pedal device makes it difficult for the driver to recognize how much he/she operates the pedal. Furthermore, because the driver needs to operate the pedal only using his or her force, the driver may be fatigued in his or her feet in the event of a long drive.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing an electronic pedal apparatus mounted in a vehicle to generate an acceleration signal or a braking signal in response to manipulation by a driver.

Furthermore, it is another object of the present disclosure to provide an electronic pedal apparatus facilitating a driver to operate a same with a small force and to easily recognize the operational state of a pedal by generating a haptic signal although the operational displacement of the pedal is very small, reducing driver fatigue.

Furthermore, it is yet another object of the present disclosure to provide an electronic pedal apparatus configured for detecting operation of a pedal through a dual detecting structure using a Hall sensor and a pressure sensor, further ensuring safety during operation of the pedal.

In accordance with an aspect of the present disclosure, the above and other objects may be accomplished by the provision of an electronic pedal apparatus including an accelerator pedal module including an accelerator pedal pad, a brake pedal module including a brake pedal pad, a pedal housing to which the accelerator pedal module and the brake pedal module are pivotably mounted while being spaced from each other in a leftward-rightward direction, an accelerator pedal detecting unit mounted in the pedal housing and the accelerator pedal module to detect pivotal movement of the accelerator pedal module, a brake pedal detecting unit mounted in the pedal housing and the brake pedal module to detect pivotal movement of the brake pedal module, and a printed circuit board (PCB) mounted in the pedal housing to generate signals related to pedal functions of a vehicle upon receiving signals from the accelerator pedal detecting unit and the brake pedal detecting unit.

The electronic pedal apparatus may further include an accelerator pedal haptic motor and a brake pedal haptic motor respectively mounted to the accelerator pedal pad and the brake pedal pad to generate haptic signals under the control of the PCB when the accelerator pedal pad and the brake pedal pad are pivoted by operation force applied thereto by the driver.

The accelerator pedal haptic motor and the brake pedal haptic motor may be configured to generate different types of haptic signals or haptic signals having different intensities from each other.

As amount of pivotal movement of the accelerator pedal pad and the brake pedal pad caused by operation force applied thereto by the driver increases, the intensity of the haptic signal generated from the accelerator pedal haptic motor and the intensity of the haptic signal generated from the brake pedal haptic motor may increase.

The electronic pedal apparatus may include a dual detecting structure configured so that the accelerator pedal detecting unit is configured to detect the pivotal movement of the accelerator pedal module using a plurality of sensors and the brake pedal detecting unit is configured to detect the pivotal movement of the brake pedal module using a plurality of sensors.

The accelerator pedal detecting unit may simultaneously detect the operational displacement of the accelerator pedal module and operation force applied to the accelerator pedal module.

The brake pedal detecting unit may simultaneously detect the operational displacement of the brake pedal module and operation force applied to the brake pedal module.

The accelerator pedal detecting unit may include an accelerator pedal magnet fixedly coupled to a flange portion extending downwards from the accelerator pedal pad, an accelerator pedal Hall sensor mounted in the pedal housing to face the accelerator pedal magnet to detect a change in magnetic flux in response to change in the position of the accelerator pedal magnet due to the pivotal movement of the accelerator pedal pad, and an accelerator pedal pressure sensor fixedly mounted in the pedal housing to be in contact with the lower end portion of an accelerator pedal return spring to detect a pressure when the accelerator pedal return spring is compressed by pivotal movement of the accelerator pedal pad caused by operation force applied thereto by the driver.

The PCB may compare a detecting value received from the accelerator pedal Hall sensor and a detecting value received from the accelerator pedal pressure sensor with each other. Upon concluding that the compared detecting values are equal to each other or a difference between the compared detecting values is within a predetermined normal range, the PCB may be configured to determine that the current state of the electronic pedal apparatus is normal. When the difference between the compared detecting values is outside the predetermined normal range, the PCB may be configured to determine that the current state of the electronic pedal apparatus is abnormal. Upon determining that the current state of the electronic pedal apparatus is normal, the PCB may be configured to generate a signal related to acceleration of a vehicle, and upon determining that the current state of the electronic pedal apparatus is abnormal, the PCB may be configured to generate an error signal.

The accelerator pedal module may include an accelerator pedal lower bracket pivotably coupled at the lower end portion thereof to the pedal housing via an accelerator pedal hinge pin. The accelerator pedal pad may be coupled to the accelerator pedal lower bracket and may be operated by the driver, and the accelerator pedal return spring may support the accelerator pedal pad to apply return force to the accelerator pedal pad.

The accelerator pedal module may further include an accelerator pedal tactile feedback unit mounted so that first and second end portions thereof are supported by the pedal housing and the accelerator pedal lower bracket. When the accelerator pedal pad is pivoted by operation force applied thereto by the driver, the accelerator pedal tactile feedback unit may be elastically deformed and may provide pedal tactile feedback to the driver.

The accelerator pedal tactile feedback unit may include a lower cover, which is secured to the pedal housing and includes a guide portion extending in an upward-downward direction, an upper cover, which is supported by the accelerator pedal lower bracket and includes a guide protrusion movably inserted into the guide portion, a cover return spring, which is inserted into the guide portion and has both end portions supported by the lower cover and the guide protrusion, and an elastic member, which accommodates the guide portion and the guide protrusion therein and has both end portions supported by the lower cover and the upper cover. In a response that the upper cover moves toward the lower cover, the elastic member may be compressed and may produce pedal tactile feedback.

The accelerator pedal tactile feedback unit may be disposed close to the accelerator pedal hinge pin, the accelerator pedal magnet may be disposed far from the accelerator pedal hinge pin, and the accelerator pedal return spring may be disposed between the accelerator pedal tactile feedback unit and the accelerator pedal magnet.

The brake pedal detecting unit may include a brake pedal magnet fixedly coupled to an end portion of a brake pedal lower bracket, a brake pedal Hall sensor mounted in the pedal housing to face the brake pedal magnet to detect a change in magnetic flux in response to change in the position of the brake pedal magnet due to the pivotal movement of the brake pedal pad, and a brake pedal pressure sensor fixedly mounted in the pedal housing to be in contact with the lower end portion of a brake pedal return spring to detect a pressure when the brake pedal return spring is compressed by the pivotal movement of the brake pedal pad caused by operation force applied thereto by the driver.

The PCB may compare a detecting value received from the brake pedal Hall sensor and a detecting value received from the brake pedal pressure sensor with each other. Upon concluding that the compared detecting values are equal to each other or a difference between the compared detecting values is within a predetermined normal range, the PCB may be configured to determine that the current state of the electronic pedal apparatus is normal. When the difference between the compared detecting values is outside the predetermined normal range, the PCB may be configured to determine that the current state of the electronic pedal apparatus is abnormal. Upon determining that the current state of the electronic pedal apparatus is normal, the PCB may be configured to generate a signal related to braking of a vehicle, and upon determining that the current state of the electronic pedal apparatus is abnormal, the PCB may be configured to generate an error signal.

The brake pedal module may include a connection bracket coupled to a protrusion extending upwards from the brake pedal lower bracket and formed to surround the brake pedal haptic motor. The brake pedal lower bracket may be pivotably coupled at the lower end portion thereof to the pedal housing via a brake pedal hinge pin, the brake pedal pad may be coupled to the connection bracket and may be operated by the driver, and the brake pedal return spring may support the brake pedal pad via the connection bracket to apply return force to the brake pedal pad.

The brake pedal module may further include a brake pedal tactile feedback unit mounted so that first and second end portions thereof are supported by the pedal housing and the brake pedal lower bracket. When the brake pedal pad is pivoted by operation force applied thereto by the driver, the brake pedal tactile feedback unit may be elastically deformed and may provide pedal tactile feedback to the driver.

The brake pedal tactile feedback unit may include a lower cover, which is secured to the pedal housing and includes a guide portion extending in the upward-downward direction, an upper cover, which is supported by the brake pedal lower bracket and includes a guide protrusion movably inserted into the guide portion, a cover return spring, which is inserted into the guide portion and has both end portions supported by the lower cover and the guide protrusion, and an elastic member, which accommodates the guide portion and the guide protrusion therein and has both end portions supported by the lower cover and the upper cover. In a response that the upper cover moves toward the lower cover, the elastic member may be compressed and may produce pedal tactile feedback.

The brake pedal tactile feedback unit may be disposed close to the brake pedal hinge pin, the brake pedal magnet may be disposed far from the brake pedal hinge pin, and the brake pedal return spring may be disposed between the brake pedal tactile feedback unit and the brake pedal magnet.

In accordance with another aspect of the present disclosure, there is provided an electronic pedal apparatus including a pedal housing, an accelerator pedal module and a brake pedal module pivotably mounted to the pedal housing while being spaced from each other in a leftward-rightward direction, an accelerator pedal detecting unit mounted in the pedal housing and the accelerator pedal module to simultaneously detect the operational displacement of the accelerator pedal module and operation force applied thereto, a brake pedal detecting unit mounted in the pedal housing and the brake pedal module to simultaneously detect the operational displacement of the brake pedal module and operation force applied thereto, an accelerator pedal haptic motor coupled to the accelerator pedal module to generate a haptic signal when an accelerator pedal pad is pivoted by operation force applied thereto by the driver, a brake pedal haptic motor coupled to the brake pedal module to generate a haptic signal in a response that a brake pedal pad is pivoted by operation force applied thereto by the driver, and a printed circuit board (PCB) mounted in the pedal housing to cause the accelerator pedal haptic motor and the brake pedal haptic motor to generate haptic signals upon receiving signals from the accelerator pedal detecting unit and the brake pedal detecting unit. The accelerator pedal haptic motor and the brake pedal haptic motor may be controlled by the PCB to generate different types of haptic signals or haptic signals having different intensities from each other.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

It may be understood that the appended drawings are not necessarily to scale, presenting a somewhat simplified representation of various features illustrative of the basic principles of the present disclosure. The predetermined design features of the present disclosure as included herein, including, for example, specific dimensions, orientations, locations, and shapes will be determined in part by the particularly intended application and use environment.

In the figures, reference numbers refer to the same or equivalent portions of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Hereinafter, the exemplary embodiments included in the present specification will be described in detail with reference to the accompanying drawings, and the same or similar elements are denoted by the same reference numerals even though they are depicted in different drawings, and redundant descriptions thereof will be omitted.

In the following description, with respect to constituent elements used in the following description, the suffixes "module" and "unit" are used only in consideration of facilitation of description, and do not have mutually distinguished meanings or functions.

Furthermore, in the following detailed description included in the present specification, a detailed description of known functions and configurations incorporated herein will be omitted when a same may make the subject matter of the exemplary embodiments included in the present specification rather unclear.

Furthermore, the accompanying drawings are provided only for a better understanding of the exemplary embodiments included in the present specification and are not intended to limit the technical ideas included in the present specification. Therefore, it should be understood that the accompanying drawings include all modifications, equivalents, and substitutions within the scope and spirit of the present disclosure.

It will be understood that although the terms "first", "second", etc., may be used herein to describe various components, these components should not be limited by these terms. These terms are only used to distinguish one component from another component.

It will be understood that when a component is referred to as being "connected to" or "coupled to" another component, it may be directly connected to or coupled to another component, or intervening components may be present.

On the other hand, when a component is referred to as being "directly connected to" or "directly coupled to" another component, there are no intervening components present.

As used herein, the singular form is directed to include the plural forms as well, unless the context clearly indicates otherwise.

It will be further understood that the terms "comprises", "comprising", "includes", and/or "including", when used herein, specify the presence of stated features, integers, steps, operations, elements, components, or combinations thereof, but do not preclude the presence or addition of one or more other features, integers, steps, operations, elements, components, or combinations thereof.

Furthermore, the terms "unit" and "control unit" forming part of the names of the motor control unit (MCU) and the hybrid control unit (HCU) are merely terms that are widely used in the naming of a controller configured for controlling a predetermined function of a vehicle, and should not be construed as meaning a generic function unit.

To control the function peculiar thereto, a controller may include a communication device, which communicates with other controllers or sensors, a memory, which stores therein an operating system, logic commands, and input/output information, and one or more processors, which perform determinations, calculations, and decisions necessary for control of the function peculiar thereto.

Hereinafter, an electronic pedal device according to an exemplary embodiment of the present disclosure will be described with reference to the accompanying drawings.

An electronic pedal device according to an exemplary embodiment of the present disclosure is of an organ type, and as shown in FIGS. 1 to 6, includes an accelerator pedal module 200 including an accelerator pedal pad 230, a brake pedal module 300 including a brake pedal pad 340, a pedal housing 100 to which the accelerator pedal module 200 and the brake pedal module 300 are pivotably mounted while being spaced from each other in a leftward-rightward direction, an accelerator pedal detecting unit 400 mounted in the pedal housing 100 and the accelerator pedal module 200 to detect pivotal movement of the accelerator pedal module 200, a brake pedal detecting unit 500 mounted in the pedal housing 100 and the brake pedal module 300 to detect pivotal movement of the brake pedal module 300, and a printed circuit board (PCB) 600 mounted in the pedal housing 100 to generate signals related to pedal functions of a vehicle upon receiving signals from the accelerator pedal detecting unit 400 and the brake pedal detecting unit 500.

The pedal housing 100 is fixedly mounted in the space below the driver's seat, and is formed in the shape of a box having an empty interior.

The pedal housing 100 includes a cover 110, and the upper portion of the pedal housing 100 is covered by the cover 110.

The accelerator pedal module 200 includes an accelerator pedal lower bracket 220 pivotably coupled at the lower end portion thereof to the pedal housing 100 via an accelerator pedal hinge pin 210, an accelerator pedal pad 230 coupled to the accelerator pedal lower bracket 220 and formed to be operated by the driver, and an accelerator pedal return spring 240 supporting the accelerator pedal pad 230 to apply return force to the accelerator pedal pad 230.

The accelerator pedal lower bracket 220 is of an organ type, the upper end portion of which pivots back and forth about the accelerator pedal hinge pin 210 coupled to the lower end portion thereof. The accelerator pedal lower bracket 220 is configured as a pedal arm of a general pedal device.

The rear end portion of the accelerator pedal pad 230 is located on the accelerator pedal lower bracket 220, and is coupled to the accelerator pedal lower bracket 220 via a plurality of bolts 221. The front end portion of the accelerator pedal pad 230 extends forwards.

The accelerator pedal return spring 240 is mounted ahead of the accelerator pedal lower bracket 220 to support the accelerator pedal pad 230. The accelerator pedal return spring 240 may include a plurality of springs having different spring forces.

When the accelerator pedal pad 230 is pivoted forwards by operation force applied thereto by the driver, the accelerator pedal return spring 240 is compressed. When the operation force applied to the accelerator pedal pad 230 by the driver is released, the accelerator pedal return spring 240 is restored to the original shape thereof. In the instant case, the accelerator pedal pad 230 is pivoted by the spring force of the accelerator pedal return spring 240, and returns to the initial position thereof.

The accelerator pedal module 200 further includes an accelerator pedal tactile feedback unit 250, which is mounted so that both end portions thereof are supported by the pedal housing 100 and the accelerator pedal lower bracket 220. When the accelerator pedal pad 230 is pivoted by operation force applied thereto by the driver, the accelerator pedal tactile feedback unit 250 is elastically deformed, providing pedal tactile feedback to the driver.

The driver may feel soft pedal tactile feedback through the accelerator pedal tactile feedback unit 250. However, the present disclosure is not limited thereto.

Figure 1:
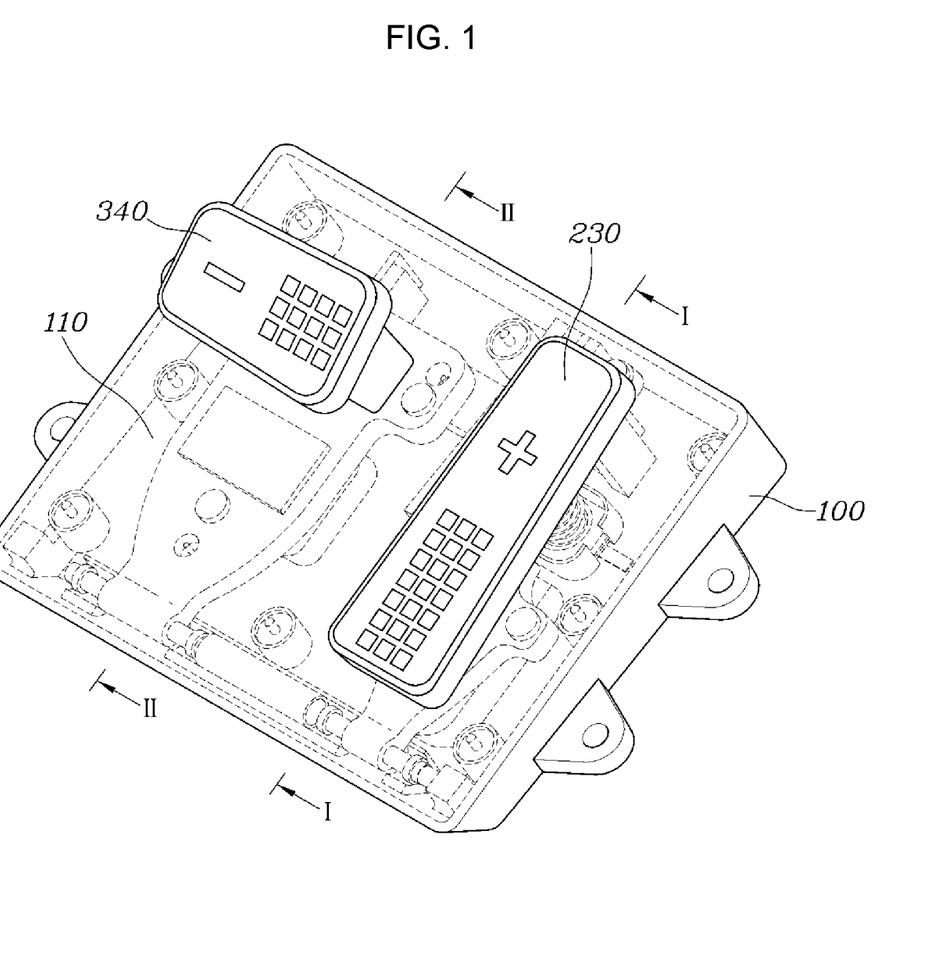
FIG. 1 is a perspective view of an electronic pedal device according to an exemplary embodiment of the present disclosure.
Figure 2:
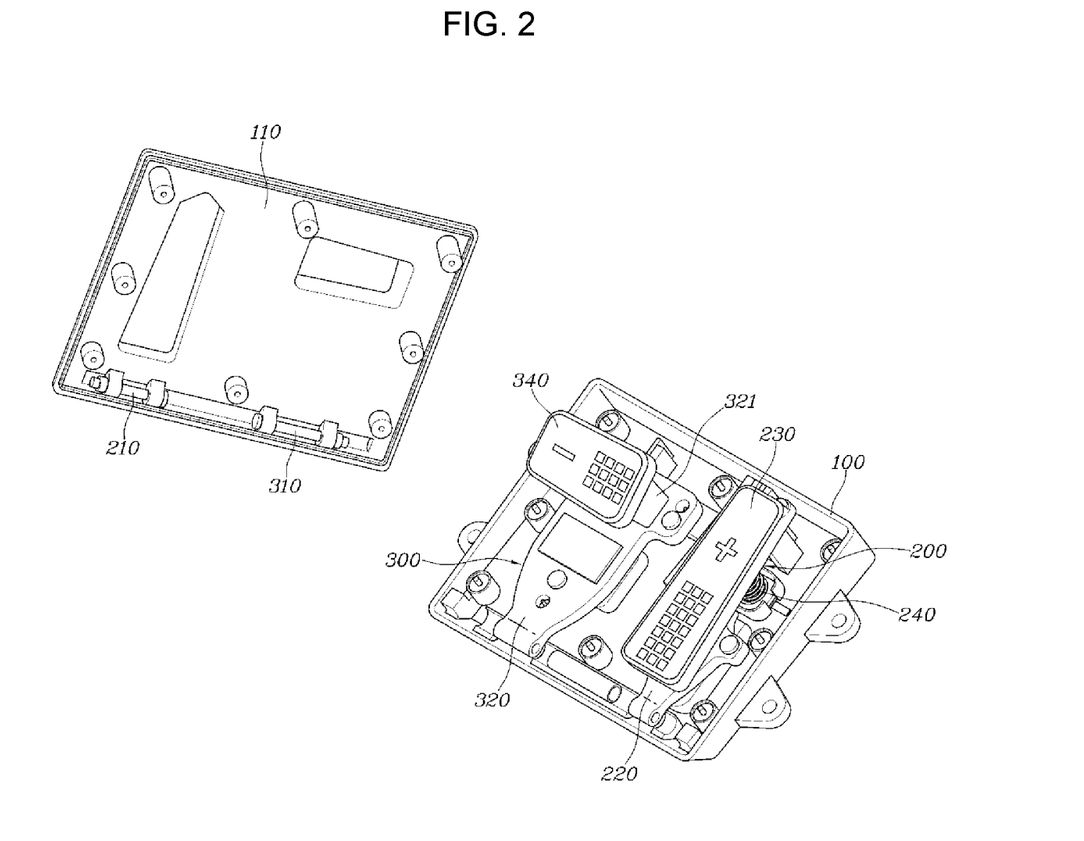
FIG. 2 is a view of the electronic pedal device shown in FIG. 1, with a cover removed therefrom.
Figure 3:
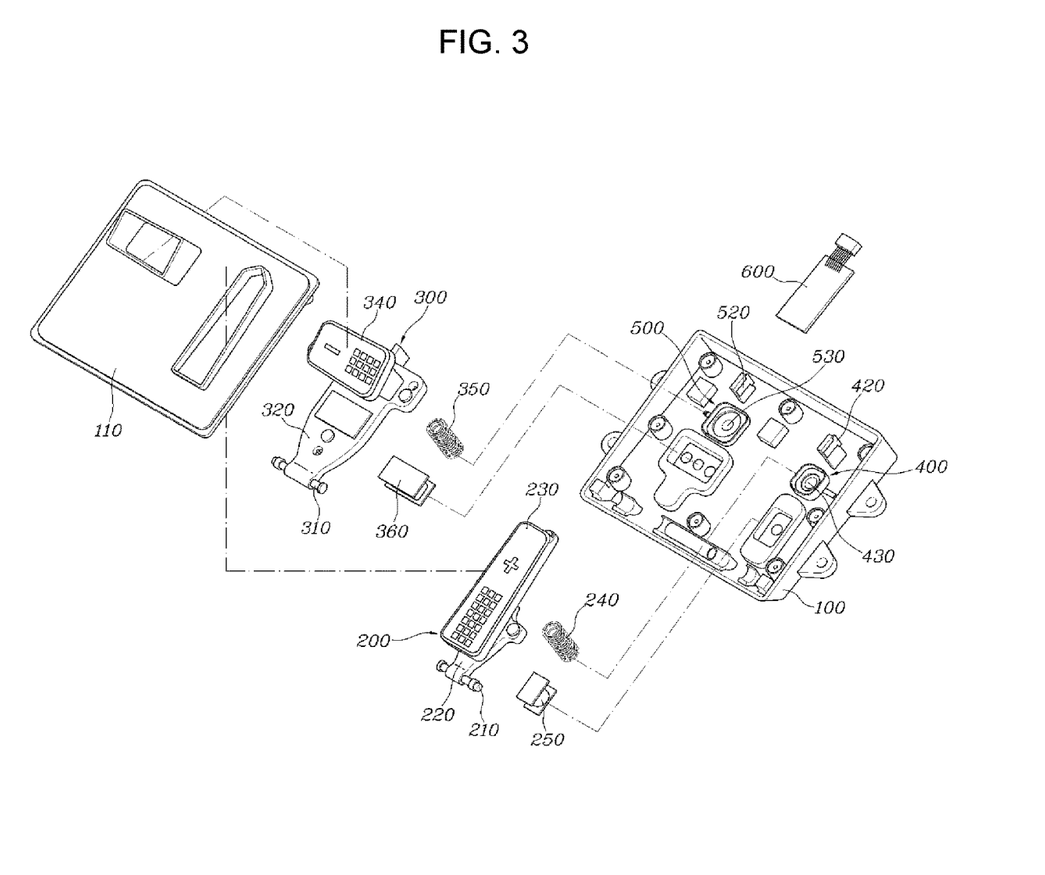
FIG. 3 is an exploded perspective view of the electronic pedal device shown in FIG. 1.
Figure 4:
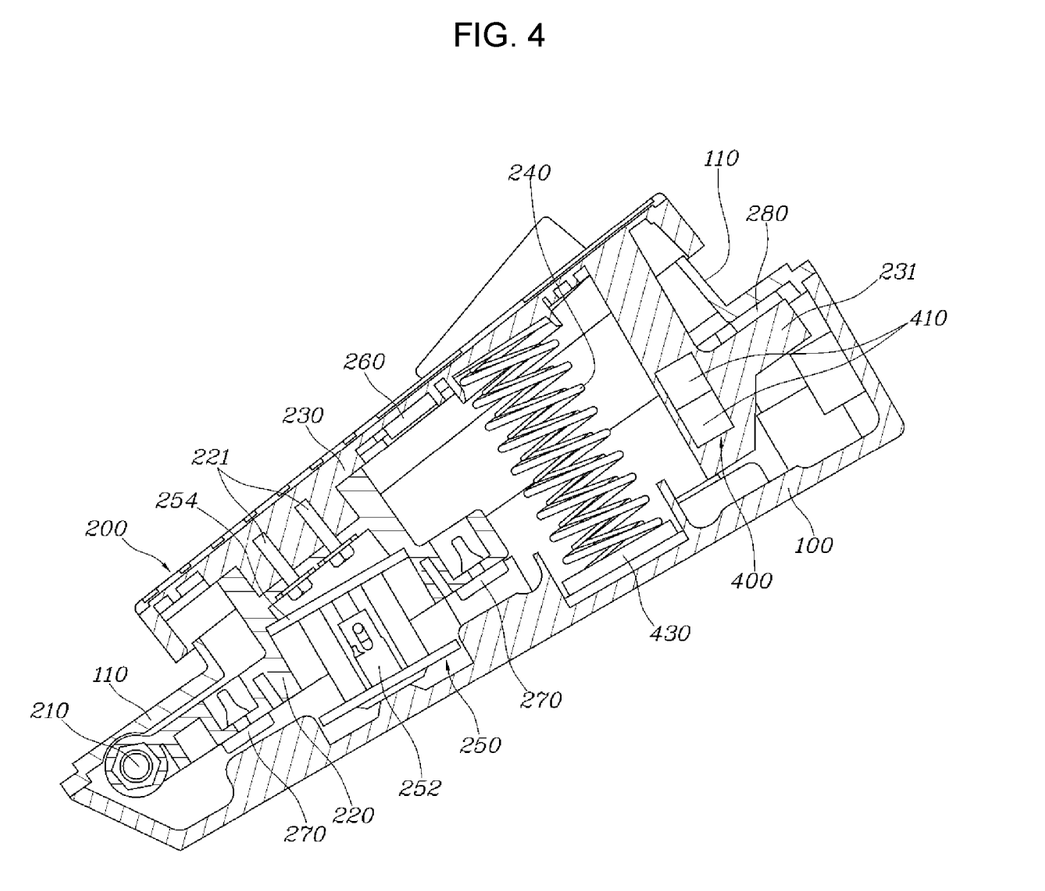
FIG. 4 and FIG. 5 are cross-sectional views taken along line I-I and line II-II in FIG. 1.
Figure 5:
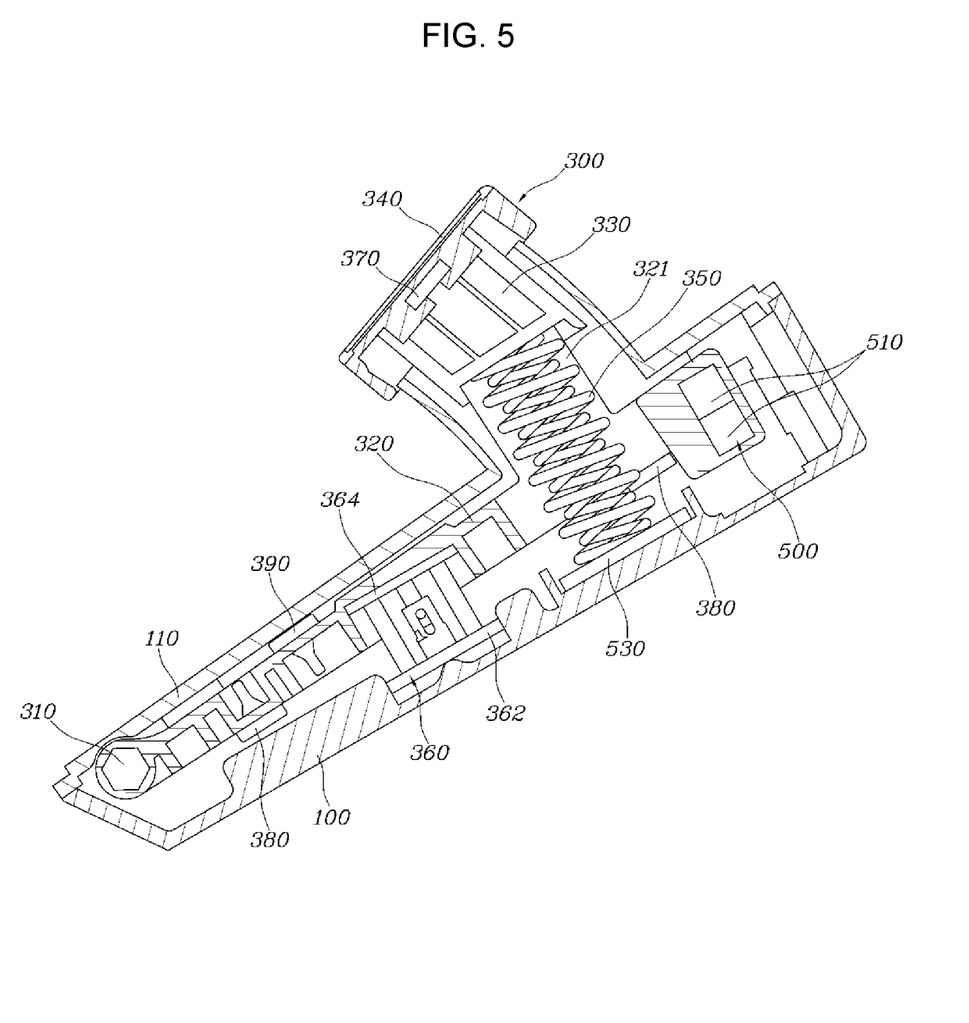
Figure 6:
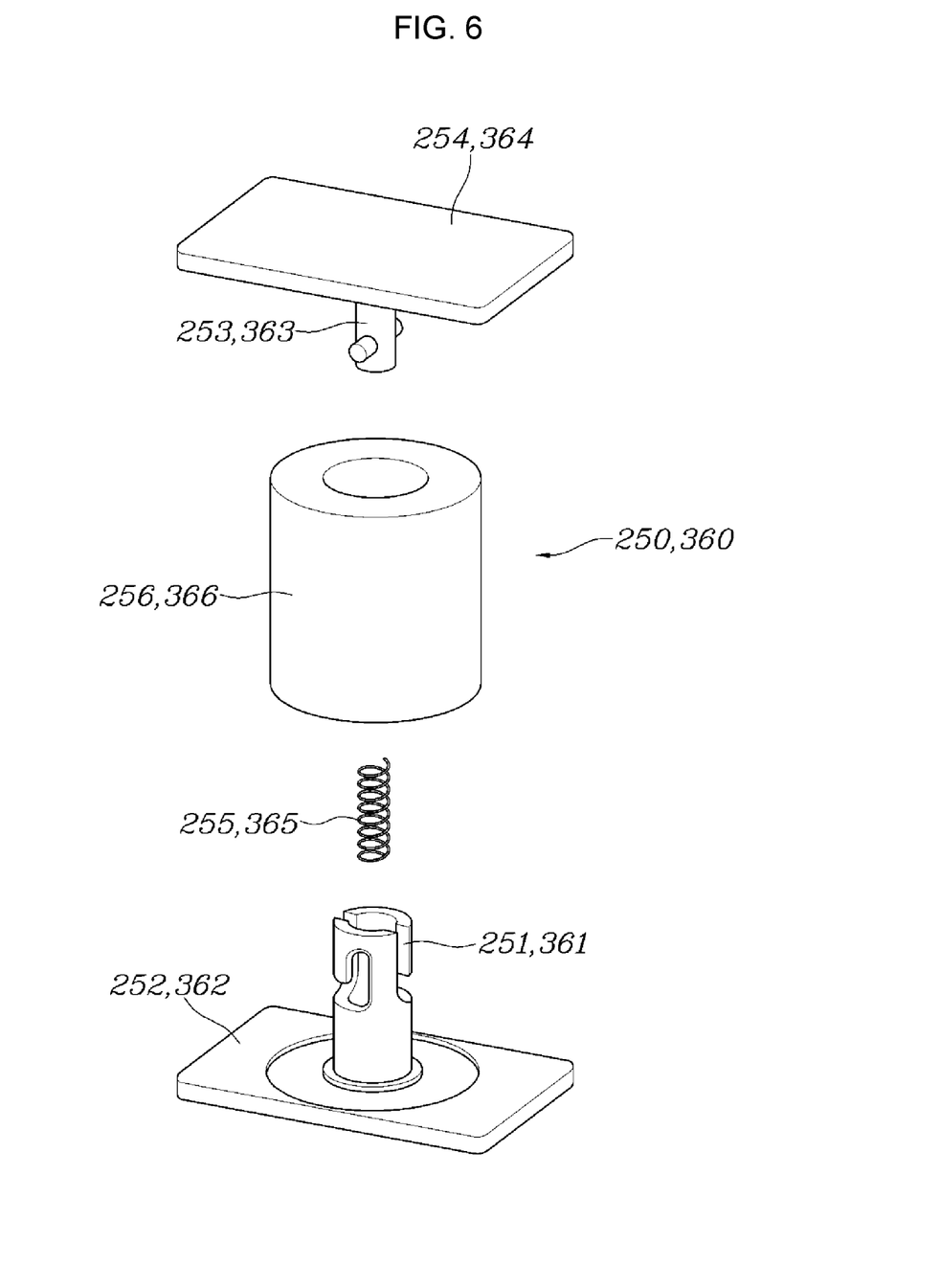
FIG. 6 is an exploded perspective view of an accelerator pedal tactile feedback unit and a brake pedal tactile feedback unit according to an exemplary embodiment of the present disclosure.

As shown in FIG. 6, the accelerator pedal tactile feedback unit 250 includes a lower cover 252, which is secured to the pedal housing 100 and includes a guide portion 251 extending in the upward-downward direction, an upper cover 254, which is supported by the accelerator pedal lower bracket 220 and includes a guide protrusion 253 movably inserted into the guide portion 251, a cover return spring 255, which is inserted into the guide portion 251 so that both end portions thereof are supported by the lower cover 252 and the guide protrusion 253, and an elastic member 256, which accommodates the guide portion 251 and the guide protrusion 253 therein and is disposed so that both end portions thereof are supported by the lower cover 252 and the upper cover 254. When the upper cover 254 moves toward the lower cover 252, the elastic member 256 is compressed, producing pedal tactile feedback.

The elastic member 256 may be implemented as a sponge member, an air-filled cushioning member, a rubber member, a silicone member, a spring, or the like.

The accelerator pedal module 200 further includes an accelerator pedal haptic motor 260, which is coupled to the accelerator pedal pad 230 and generates a haptic signal under the control of the PCB 600 when the accelerator pedal pad 230 is pivoted by operation force applied thereto by the driver.

The pedal device according to an exemplary embodiment of the present disclosure operates in a pressure operation manner so that the driver is configured for operating the same with a small force. Although the operational displacement of the pedal is very small, the driver may easily recognize the operational state of the accelerator pedal by operation of the accelerator pedal haptic motor 260.

It may be preferable to dispose the accelerator pedal haptic motor 260 in the middle portion of the accelerator pedal pad 230. The reason for this is to enable the haptic signal from the accelerator pedal haptic motor 260 to be uniformly transmitted over the accelerator pedal pad 230.

As the amount of the pivotal movement of the accelerator pedal pad 230 caused by operation force applied thereto by the driver increases, the intensity of the haptic signal generated from the accelerator pedal haptic motor 260 increases linearly or increases with a quadratic function form. Accordingly, the driver may easily recognize the pedal operation amount.

An accelerator pedal first stopper 270 is coupled to the lower surface of the accelerator pedal lower bracket 220. When the accelerator pedal pad 230 is pivoted to the full-stroke position thereof, the accelerator pedal first stopper 270 comes into contact with the pedal housing 100, preventing the accelerator pedal pad 230 from being pivoted beyond the full-stroke position.

The accelerator pedal first stopper 270 is a full-stroke stopper for defining the full-stroke position of the accelerator pedal pad 230, and is formed of a cushioning material, such as rubber or silicone. However, the present disclosure is not limited thereto.

The accelerator pedal detecting unit 400 may include a duplex configuration to detect pivotal movement of the accelerator pedal module 200 using a plurality of sensors, facilitating more stable and accurate detection.

The accelerator pedal detecting unit 400 may detect the operational displacement of the accelerator pedal module 200 and the operation force applied thereto at a same time.

The accelerator pedal detecting unit 400 includes an accelerator pedal magnet 410, which is fixedly coupled to a flange portion 231 extending downwards from the accelerator pedal pad 230, an accelerator pedal Hall sensor 420, which is mounted in the pedal housing 100 to face the accelerator pedal magnet 410 to detect a change in magnetic flux in response to change in the position of the accelerator pedal magnet 410 due to pivotal movement of the accelerator pedal pad 230, and an accelerator pedal pressure sensor 430, which is fixedly mounted in the pedal housing 100 to be in contact with the lower end portion of the accelerator pedal return spring 240 to detect a pressure when the accelerator pedal return spring 240 is compressed by pivotal movement of the accelerator pedal pad 230 caused by operation force applied thereto by the driver.

The flange portion 231 is formed to extend downwards from the front end portion of the accelerator pedal pad 230. The flange portion 231 is inserted into the pedal housing 100, and the accelerator pedal magnet 410 is fixedly mounted to a portion of the flange portion 231, which is located in the pedal housing 100.

The accelerator pedal Hall sensor 420 and the accelerator pedal pressure sensor 430 are electrically connected to the PCB 600 via wires.

The PCB 600 compares a detecting value received from the accelerator pedal Hall sensor 420 and a detecting value received from the accelerator pedal pressure sensor 430 with each other. When the two detecting values are equal to each other or a difference therebetween is within a predetermined normal range, the PCB 600 is configured to determine that the current state of the device is normal through correction, and when the difference therebetween is outside the predetermined normal range, the PCB 600 is configured to determine that the current state of the device is abnormal. Upon determining that the current state of the device is normal, the PCB 600 generates a signal related to acceleration of the vehicle, and upon determining that the current state of the device is abnormal, the PCB 600 generates an error signal.

Upon generating an error signal, the PCB 600 may enter a limp home mode, or may output a message indicating an error to the driver, rather than generating a signal related to acceleration.

According to an exemplary embodiment of the present disclosure, an accelerator pedal second stopper 280 is coupled to an upper surface of the flange portion 231 of the accelerator pedal pad 230. When the accelerator pedal pad 230 returns due to the spring force of the accelerator pedal return spring 240, the accelerator pedal second stopper 280 comes into contact with the pedal housing 100, defining the initial position of the accelerator pedal pad 230.

The accelerator pedal second stopper 280 is a stopper for defining the initial position to which the accelerator pedal pad 230 returns due to the accelerator pedal return spring 240, and is formed of a cushioning material, such as rubber or silicone. However, the present disclosure is not limited thereto.

The accelerator pedal module 200 according to an exemplary embodiment of the present disclosure is configured so that the accelerator pedal tactile feedback unit 250 is disposed relatively close to the accelerator pedal hinge pin 210, the accelerator pedal magnet 410 is disposed relatively far from the accelerator pedal hinge pin 210, and the accelerator pedal return spring 240 is disposed between the accelerator pedal tactile feedback unit 250 and the accelerator pedal magnet 410.

Because the accelerator pedal magnet 410 is disposed relatively far from the accelerator pedal hinge pin 210, even when the operational displacement of the accelerator pedal pad 230 is very small, the displacement of the accelerator pedal magnet 410 is large, increasing the detecting power of the accelerator pedal Hall sensor 420.

Because the accelerator pedal tactile feedback unit 250 is configured to merely produce pedal tactile feedback in response to operation of the accelerator pedal pad 230, the accelerator pedal tactile feedback unit 250 includes a relatively small size, and thusis disposed relatively close to the accelerator pedal hinge pin 210.

The accelerator pedal return spring 240 is a portion for implementing overall operation force when the driver operates the accelerator pedal pad 230. The accelerator pedal return spring 240 is disposed farther from the accelerator pedal hinge pin 210 than the accelerator pedal tactile feedback unit 250 to include a sufficient length, implementing a sufficient amount of operation force when the driver operates the accelerator pedal pad 230.

The brake pedal module 300 according to an exemplary embodiment of the present disclosure includes a brake pedal lower bracket 320 pivotably coupled at the lower end portion thereof to the pedal housing 100 via a brake pedal hinge pin 310, a connection bracket 330 coupled to a protrusion 321 extending upwards from the brake pedal lower bracket 320 and formed to surround a brake pedal haptic motor 370, a brake pedal pad 340 coupled to the connection bracket 330 and formed to be operated by the driver, and a brake pedal return spring 350 supporting the brake pedal pad 340 to apply return force to the brake pedal pad 340.

The brake pedal lower bracket 320 is of an organ type, the upper end portion of which pivots back and forth about the brake pedal hinge pin 310 coupled to the lower end portion thereof. The brake pedal lower bracket 320 is configured as a pedal arm of a general pedal device.

The protrusion 321 protrudes upwards from a front portion of the brake pedal lower bracket 320, the connection bracket 330 is fixedly coupled to the protrusion 321 via a bolt, and the brake pedal pad 340 is coupled to the connection bracket 330.

Because the brake pedal pad 340 includes a relatively small size, the connection bracket 330 is provided to surround and protect a brake pedal haptic motor to be described later.

The brake pedal return spring 350 is provided to penetrate the protrusion 321 of the brake pedal lower bracket 320 to support the brake pedal pad 340 via the connection bracket 330. The brake pedal return spring 350 may include a plurality of springs having different spring forces.

When the brake pedal pad 340 is pivoted forwards by operation force applied thereto by the driver, the brake pedal return spring 350 is compressed. When the operation force applied to the brake pedal pad 340 by the driver is released, the brake pedal return spring 350 is restored to the original shape thereof. In the instant case, the brake pedal pad 340 is pivoted by the spring force of the brake pedal return spring 350, and returns to the initial position thereof.

The brake pedal module 300 further includes a brake pedal tactile feedback unit 360, which is mounted so that both end portions thereof are supported by the pedal housing 100 and the brake pedal lower bracket 320. When the brake pedal pad 340 is pivoted by operation force applied thereto by the driver, the brake pedal tactile feedback unit 360 is elastically deformed, providing pedal tactile feedback to the driver.

The driver may feel soft pedal tactile feedback through the brake pedal tactile feedback unit 360. However, the present disclosure is not limited thereto.

As shown in FIG. 6, the brake pedal tactile feedback unit 360 includes a lower cover 362, which is secured to the pedal housing 100 and includes a guide portion 361 extending in the upward-downward direction, an upper cover 364, which is supported by the brake pedal lower bracket 320 and includes a guide protrusion 363 movably inserted into the guide portion 361, a cover return spring 365, which is inserted into the guide portion 361 so that both end portions thereof are supported by the lower cover 362 and the guide protrusion 363, and an elastic member 366, which accommodates the guide portion 361 and the guide protrusion 363 therein and is disposed so that both end portions thereof are supported by the lower cover 362 and the upper cover 364. When the upper cover 364 moves toward the lower cover 362, the elastic member 366 is compressed, producing pedal tactile feedback.

The elastic member 366 may be implemented as a sponge member, an air-filled cushioning member, a rubber member, a silicone member, a spring, or the like.

The brake pedal module 300 further includes a brake pedal haptic motor 370, which is coupled to the brake pedal pad 340 and generates a haptic signal under the control of the PCB 600 when the brake pedal pad 340 is pivoted by operation force applied thereto by the driver.

The pedal device according to an exemplary embodiment of the present disclosure operates in a pressure operation manner so that the driver is configured for operating the same with a small force. Although the operational displacement of the pedal is very small, the driver may easily recognize the operational state of the brake pedal by operation of the brake pedal haptic motor 370.

It may be preferable to dispose the brake pedal haptic motor 370 in the middle portion of the brake pedal pad 340. The reason for this is to enable the haptic signal from the brake pedal haptic motor 370 to be uniformly transmitted over the brake pedal pad 340 when the brake pedal pad 340 is operated.

As the amount of the pivotal movement of the brake pedal pad 340 caused by operation force applied thereto by the driver increases, the intensity of the haptic signal generated from the brake pedal haptic motor 370 increases linearly. Accordingly, the driver may easily recognize the pedal operation amount.

A brake pedal first stopper 380 is coupled to the lower surface of the brake pedal lower bracket 320. When the brake pedal pad 340 is pivoted to the full-stroke position thereof, the brake pedal first stopper 380 comes into contact with the pedal housing 100, preventing the brake pedal pad 340 from being pivoted beyond the full-stroke position.

The brake pedal first stopper 380 is a full-stroke stopper for defining the full-stroke position of the brake pedal pad 340, and is formed of a cushioning material, such as rubber or silicone. However, the present disclosure is not limited thereto.

Furthermore, a brake pedal second stopper 390 is coupled to an upper surface of the brake pedal lower bracket 320. When the brake pedal pad 340 returns due to the spring force of the brake pedal return spring 350, the brake pedal second stopper 390 comes into contact with the pedal housing 100, defining the initial position of the brake pedal pad 340.

The brake pedal second stopper 390 is a stopper for defining the initial position to which the brake pedal pad 340 returns due to the brake pedal return spring 350, and is formed of a cushioning material, such as rubber or silicone. However, the present disclosure is not limited thereto.

The brake pedal detecting unit 500 may include a duplex configuration to detect pivotal movement of the brake pedal module 300 using a plurality of sensors, facilitating more stable and accurate detection.

The brake pedal detecting unit 500 may detect the operational displacement of the brake pedal module 300 and the operation force applied thereto at the same time.

The brake pedal detecting unit 500 includes a brake pedal magnet 510, which is fixedly coupled to an end portion of the brake pedal lower bracket 320, a brake pedal Hall sensor 520, which is mounted in the pedal housing 100 to face the brake pedal magnet 510 to detect a change in magnetic flux in response to change in the position of the brake pedal magnet 510 due to the pivotal movement of the brake pedal pad 340, and a brake pedal pressure sensor 530, which is fixedly mounted in the pedal housing 100 to be in contact with the lower end portion of the brake pedal return spring 350 to detect a pressure when the brake pedal return spring 350 is compressed by the pivotal movement of the brake pedal pad 340 caused by operation force applied thereto by the driver.

The brake pedal magnet 510 is fixedly mounted to the front end portion of the brake pedal lower bracket 320, which is located in the pedal housing 100.

The brake pedal Hall sensor 520 and the brake pedal pressure sensor 530 are electrically connected to the PCB 600 via wires.

The PCB 600 compares a detecting value received from the brake pedal Hall sensor 520 and a detecting value received from the brake pedal pressure sensor 530 with each other. When the two detecting values are equal to each other or a difference therebetween is within a predetermined normal range, the PCB 600 is configured to determine that the current state of the device is normal through correction, and when the difference therebetween is outside the predetermined normal range, the PCB 600 is configured to determine that the current state of the device is abnormal. Upon determining that the current state of the device is normal, the PCB 600 generates a signal related to braking of the vehicle, and upon determining that the current state of the device is abnormal, the PCB 600 generates an error signal.

Upon generating an error signal, the PCB 600 may perform emergency braking for safety, may enter a limp home mode, or may output a message indicating an error to the driver.

The brake pedal module 300 according to an exemplary embodiment of the present disclosure is configured so that the brake pedal tactile feedback unit 360 is disposed relatively close to the brake pedal hinge pin 310, the brake pedal magnet 510 is disposed relatively far from the brake pedal hinge pin 310, and the brake pedal return spring 350 is disposed between the brake pedal tactile feedback unit 360 and the brake pedal magnet 510.

Because the brake pedal magnet 510 is disposed relatively far from the brake pedal hinge pin 310, even when the operational displacement of the brake pedal pad 340 is very small, the displacement of the brake pedal magnet 510 is large, increasing the detecting power of the brake pedal Hall sensor 520.

Because the brake pedal tactile feedback unit 360 is configured to merely produce pedal tactile feedback in response to operation of the brake pedal pad 340, the brake pedal tactile feedback unit 360 includes a relatively small size, and thus is disposed relatively close to the brake pedal hinge pin 310.

The brake pedal return spring 350 is a portion for implementing overall operation force when the driver operates the brake pedal pad 340. The brake pedal return spring 350 is disposed farther from the brake pedal hinge pin 310 than the brake pedal tactile feedback unit 360 to include a sufficient length, implementing a sufficient amount of operation force when the driver operates the brake pedal pad 340.

Furthermore, the pedal device according to an exemplary embodiment of the present disclosure is characterized in that the accelerator pedal haptic motor 260 and the brake pedal haptic motor 370 generate different types of haptic signals or haptic signals including different intensities from each other. Accordingly, the driver may easily recognize whether he/she is operating the accelerator pedal or the brake pedal, and thus it is possible to prevent the risk of erroneously operating the accelerator pedal or the brake pedal.

The electronic pedal device according to an exemplary embodiment of the present disclosure includes a pedal housing 100, an accelerator pedal module 200 and a brake pedal module 300, which are pivotably mounted to the pedal housing 100 while being spaced from each other in the leftward-rightward direction, an accelerator pedal detecting unit 400, which is mounted in the pedal housing 100 and the accelerator pedal module 200 to simultaneously detect the operational displacement of the accelerator pedal module 200 and the operation force applied thereto, a brake pedal detecting unit 500, which is mounted in the pedal housing 100 and the brake pedal module 300 to simultaneously detect the operational displacement of the brake pedal module 300 and the operation force applied thereto, an accelerator pedal haptic motor 260, which is coupled to the accelerator pedal module 200 and generates a haptic signal when an accelerator pedal pad 230 is pivoted by operation force applied thereto by the driver, a brake pedal haptic motor 370, which is coupled to the brake pedal module 300 and generates a haptic signal when a brake pedal pad 340 is pivoted by operation force applied thereto by the driver, and a printed circuit board (PCB) 600, which is mounted in the pedal housing 100 to cause the accelerator pedal haptic motor 260 and the brake pedal haptic motor 370 to generate haptic signals upon receiving signals from the accelerator pedal detecting unit 400 and the brake pedal detecting unit 500. The accelerator pedal haptic motor 260 and the brake pedal haptic motor 370 are controlled by the PCB 600 to generate different types of haptic signals or haptic signals having different intensities from each other.

As is apparent from the above description, in the electronic pedal device according to an exemplary embodiment of the present disclosure, because the accelerator pedal module 200 and the brake pedal module 300, which are disposed parallel to each other in the leftward-rightward direction, operate in a pressure operation manner, the driver is configured for operating the same with a small force. Although the operational displacement of the pedal is very small, the driver may easily recognize the operational state of the accelerator pedal or the brake pedal by operation of the accelerator pedal haptic motor 260 or the brake pedal haptic motor 370.

Furthermore, in the electronic pedal device according to an exemplary embodiment of the present disclosure, as the amount of the pivotal movement of the accelerator pedal pad 230 or the brake pedal pad 340 caused by operation force applied thereto by the driver increases, the intensity of the haptic signal generated from the accelerator pedal haptic motor 260 or the brake pedal haptic motor 370 increases linearly. Accordingly, the driver may easily recognize the pedal operation amount.

Furthermore, in the electronic pedal device according to an exemplary embodiment of the present disclosure, the accelerator pedal haptic motor 260 and the brake pedal haptic motor 370 generate different types of haptic signals or haptic signals having different intensities from each other. Accordingly, the driver may easily recognize whether he/she is operating the accelerator pedal or the brake pedal, and thus it is possible to prevent the risk of erroneously operating the accelerator pedal or the brake pedal.

Furthermore, the electronic pedal device according to an exemplary embodiment of the present disclosure detects operation of the pedal through the dual detecting structure using the Hall sensor and the pressure sensor, further ensuring safety during operation of the pedal.

Furthermore, the term related to a control device such as "controller", "control apparatus", "control unit", "control device", "control module", or "server", etc refers to a hardware device including a memory and a processor configured to execute one or more steps interpreted as an algorithm structure. The memory stores algorithm steps, and the processor executes the algorithm steps to perform one or more processes of a method in accordance with various exemplary embodiments of the present disclosure. The control device according to exemplary embodiments of the present disclosure may be implemented through a nonvolatile memory configured to store algorithms for controlling operation of various components of a vehicle or data about software commands for executing the algorithms, and a processor configured to perform operation to be described above using the data stored in the memory. The memory and the processor may be individual chips. Alternatively, the memory and the processor may be integrated in a single chip. The processor may be implemented as one or more processors. The processor may include various logic circuits and operation circuits, may process data according to a program provided from the memory, and may be configured to generate a control signal according to the processing result.

The control device may be at least one microprocessor operated by a predetermined program which may include a series of commands for carrying out the method included in the aforementioned various exemplary embodiments of the present disclosure.

The aforementioned invention can also be embodied as computer readable codes on a computer readable recording medium. The computer readable recording medium is any data storage device that can store data which may be thereafter read by a computer system and store and execute program instructions which may be thereafter read by a computer system. Examples of the computer readable recording medium include Hard Disk Drive (HDD), solid state disk (SSD), silicon disk drive (SDD), read-only memory (ROM), random-access memory (RAM), CD-ROMs, magnetic tapes, floppy discs, optical data storage devices, etc and implementation as carrier waves (e.g., transmission over the Internet). Examples of the program instruction include machine language code such as those generated by a compiler, as well as high-level language code which may be executed by a computer using an interpreter or the like.

In various exemplary embodiments of the present disclosure, each operation described above may be performed by a control device, and the control device may be configured by a plurality of control devices, or an integrated single control device.

In various exemplary embodiments of the present disclosure, the scope of the present disclosure includes software or machine-executable commands (e.g., an operating system, an application, firmware, a program, etc.) for facilitating operations according to the methods of various embodiments to be executed on an apparatus or a computer, a non-transitory computer-readable medium including such software or commands stored thereon and executable on the apparatus or the computer.

In various exemplary embodiments of the present disclosure, the control device may be implemented in a form of hardware or software, or may be implemented in a combination of hardware and software.

Furthermore, the terms such as "unit", "module", etc. included in the specification mean units for processing at least one function or operation, which may be implemented by hardware, software, or a combination thereof.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The term "and/or" may include a combination of a plurality of related listed items or any of a plurality of related listed items. For example, "A and/or B" includes all three cases such as "A", "B", and "A and B".

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the present disclosure and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. An electronic pedal apparatus comprising:
   an accelerator pedal module including an accelerator pedal pad;
   a brake pedal module including a brake pedal pad;
   a pedal housing to which the accelerator pedal module and the brake pedal module are pivotably mounted while being spaced from each other in a leftward-rightward direction thereof;
   an accelerator pedal detecting unit mounted in the pedal housing and the accelerator pedal module to detect pivotal movement of the accelerator pedal module;
   a brake pedal detecting unit mounted in the pedal housing and the brake pedal module to detect pivotal movement of the brake pedal module;
   a printed circuit board (PCB) mounted in the pedal housing to generate signals related to pedal functions of a vehicle upon receiving signals from the accelerator pedal detecting unit and the brake pedal detecting unit; and
   an accelerator pedal haptic motor and a brake pedal haptic motor respectively mounted to the accelerator pedal pad and the brake pedal pad to generate haptic signals under control of the PCB in a response that the accelerator pedal pad and the brake pedal pad are pivoted by operation force applied thereto by a driver.

2. The electronic pedal apparatus of claim 1, wherein the accelerator pedal haptic motor and the brake pedal haptic motor are configured to generate different types of haptic signals or haptic signals including different intensities from each other.

3. The electronic pedal apparatus of claim 1, wherein, in a response that amount of pivotal movement of the accelerator pedal pad and the brake pedal pad caused by operation force applied thereto by the driver increases, an intensity of the haptic signal generated from the accelerator pedal haptic motor and an intensity of the haptic signal generated from the brake pedal haptic motor increase.

4. The electronic pedal apparatus of claim 1, wherein the accelerator pedal detecting unit is configured to detect an operational displacement of the accelerator pedal module and operation force applied to the accelerator pedal module.

5. The electronic pedal apparatus of claim 1, wherein the brake pedal detecting unit is configured to detect an operational displacement of the brake pedal module and operation force applied to the brake pedal module.

6. The electronic pedal apparatus of claim 1, wherein the accelerator pedal detecting unit includes:
   an accelerator pedal magnet fixedly coupled to a flange portion extending downwards from the accelerator pedal pad;
   an accelerator pedal Hall sensor mounted in the pedal housing to face the accelerator pedal magnet to detect a change in magnetic flux in response to change in position of the accelerator pedal magnet due to the pivotal movement of the accelerator pedal pad; and
   an accelerator pedal pressure sensor fixedly mounted in the pedal housing to be in contact with a lower end portion of an accelerator pedal return spring to detect a pressure in a response that the accelerator pedal return spring is compressed by the pivotal movement of the accelerator pedal pad caused by operation force applied thereto by a driver.

7. The electronic pedal apparatus of claim 6,
   wherein the PCB is configured to compare a detecting value received from the accelerator pedal Hall sensor and a detecting value received from the accelerator pedal pressure sensor with each other,
   wherein, upon concluding that the compared detecting values are equal to each other or a difference between the compared detecting values is within a predetermined normal range, the PCB is configured to conclude that a current state of the electronic pedal apparatus is normal, wherein, upon concluding that the difference between the compared detecting values is outside the predetermined normal range, the PCB is configured to conclude that the current state of the electronic pedal apparatus is abnormal, wherein, upon concluding that the current state of the electronic pedal apparatus is normal, the PCB is configured to generate a signal related to acceleration of the vehicle, and wherein, upon concluding that the current state of the electronic pedal apparatus is abnormal, the PCB is configured to generate an error signal.

8. The electronic pedal apparatus of claim 6,
wherein the accelerator pedal module includes an accelerator pedal lower bracket pivotably coupled at a lower end portion thereof to the pedal housing via an accelerator pedal hinge pin,
wherein the accelerator pedal pad is coupled to the accelerator pedal lower bracket and is configured to be operated by the driver, and
wherein the accelerator pedal return spring supports the accelerator pedal pad to apply return force to the accelerator pedal pad.

9. The electronic pedal apparatus of claim 8,
wherein the accelerator pedal module further includes an accelerator pedal tactile feedback unit mounted so that first and second end portions thereof are supported by the pedal housing and the accelerator pedal lower bracket, and
wherein, in a response that the accelerator pedal pad is pivoted by operation force applied thereto by the driver, the accelerator pedal tactile feedback unit is elastically deformed and provides pedal tactile feedback to the driver.

10. The electronic pedal apparatus of claim 9, wherein the accelerator pedal tactile feedback unit includes:
a lower cover secured to the pedal housing, the lower cover including a guide portion extending in an upward-downward direction thereof;
an upper cover supported by the accelerator pedal lower bracket, the upper cover including a guide protrusion movably inserted into the guide portion;
a cover return spring inserted into the guide portion, the cover return spring including first and second end portions supported by the lower cover and the guide protrusion; and
an elastic member accommodating the guide portion and the guide protrusion therein, the elastic member including first and second end portions supported by the lower cover and the upper cover, and
wherein, in a response that the upper cover moves toward the lower cover, the elastic member is compressed and produces pedal tactile feedback.

11. The electronic pedal apparatus of claim 10,
wherein the accelerator pedal tactile feedback unit is disposed adjacent to the accelerator pedal hinge pin,
wherein the accelerator pedal magnet is spaced from the accelerator pedal hinge pin, and
wherein the accelerator pedal return spring is disposed between the accelerator pedal tactile feedback unit and the accelerator pedal magnet.

12. The electronic pedal apparatus of claim 1, wherein the brake pedal detecting unit includes:
a brake pedal magnet fixedly coupled to an end portion of a brake pedal lower bracket;
a brake pedal Hall sensor mounted in the pedal housing to face the brake pedal magnet to detect a change in magnetic flux in response to change in position of the brake pedal magnet due to the pivotal movement of the brake pedal pad; and
a brake pedal pressure sensor fixedly mounted in the pedal housing to be in contact with a lower end portion of a brake pedal return spring to detect a pressure in response that the brake pedal return spring is compressed by the pivotal movement of the brake pedal pad caused by operation force applied thereto by a driver.

13. The electronic pedal apparatus of claim 12,
wherein the PCB is configured to compare a detecting value received from the brake pedal Hall sensor and a detecting value received from the brake pedal pressure sensor with each other,
wherein, upon concluding that the compared detecting values are equal to each other or a difference between the compared detecting values is within a predetermined normal range, the PCB is configured to conclude that a current state of the electronic pedal apparatus is normal,
wherein, upon concluding that the difference between the compared detecting values is outside the predetermined normal range, the PCB is configured to conclude that the current state of the electronic pedal apparatus is abnormal,
wherein, upon concluding that the current state of the electronic pedal apparatus is normal, the PCB is configured to generate a signal related to braking of a vehicle, and
wherein, upon concluding that the current state of the electronic pedal apparatus is abnormal, the PCB is configured to generate an error signal.

14. The electronic pedal apparatus of claim 12,
wherein the brake pedal module includes a connection bracket coupled to a protrusion extending upwards from the brake pedal lower bracket and formed to surround a brake pedal haptic motor,
wherein the brake pedal lower bracket is pivotably coupled at a lower end portion thereof to the pedal housing via a brake pedal hinge pin,
wherein the brake pedal pad is coupled to the connection bracket and is configured to be operated by the driver, and
wherein the brake pedal return spring supports the brake pedal pad via the connection bracket to apply return force to the brake pedal pad.

15. The electronic pedal apparatus of claim 14,
wherein the brake pedal module further includes a brake pedal tactile feedback unit mounted so that first and second end portions thereof are supported by the pedal housing and the brake pedal lower bracket, and
wherein, in a response that the brake pedal pad is pivoted by operation force applied thereto by the driver, the brake pedal tactile feedback unit is elastically deformed and provides pedal tactile feedback to the driver.

16. The electronic pedal apparatus of claim 15, wherein the brake pedal tactile feedback unit includes:
a lower cover secured to the pedal housing, the lower cover including a guide portion extending in an upward-downward direction thereof;
an upper cover supported by the brake pedal lower bracket, the upper cover including a guide protrusion movably inserted into the guide portion;
a cover return spring inserted into the guide portion, the cover return spring including first and second end portions supported by the lower cover and the guide protrusion; and an elastic member accommodating the guide portion and the guide protrusion therein, the elastic member including first and second end portions supported by the lower cover and the upper cover, and wherein, in a response that the upper cover moves toward the lower cover, the elastic member is compressed and produces pedal tactile feedback.

17. The electronic pedal apparatus of claim 16, wherein the brake pedal tactile feedback unit is disposed adjacent to the brake pedal hinge pin, wherein the brake pedal magnet is spaced from the brake pedal hinge pin, and wherein the brake pedal return spring is disposed between the brake pedal tactile feedback unit and the brake pedal magnet.

18. An electronic pedal apparatus comprising:

an accelerator pedal module including an accelerator pedal pad;

a brake pedal module including a brake pedal pad;

a pedal housing to which the accelerator pedal module and the brake pedal module are pivotably mounted while being spaced from each other in a leftward-rightward direction thereof;

an accelerator pedal detecting unit mounted in the pedal housing and the accelerator pedal module to detect pivotal movement of the accelerator pedal module;

a brake pedal detecting unit mounted in the pedal housing and the brake pedal module to detect pivotal movement of the brake pedal module;

a printed circuit board (PCB) mounted in the pedal housing to generate signals related to pedal functions of a vehicle upon receiving signals from the accelerator pedal detecting unit and the brake pedal detecting unit; and a dual detecting structure configured so that the accelerator pedal detecting unit is configured to detect the pivotal movement of the accelerator pedal module using a plurality of sensors and the brake pedal detecting unit is configured to detect the pivotal movement of the brake pedal module using a plurality of sensors.

19. An electronic pedal apparatus comprising:

a pedal housing;

an accelerator pedal module and a brake pedal module pivotably mounted to the pedal housing while being spaced from each other in a leftward-rightward direction thereof;

an accelerator pedal detecting unit mounted in the pedal housing and the accelerator pedal module to simultaneously detect an operational displacement of the accelerator pedal module and operation force applied thereto;

a brake pedal detecting unit mounted in the pedal housing and the brake pedal module to simultaneously detect an operational displacement of the brake pedal module and operation force applied thereto;

an accelerator pedal haptic motor coupled to the accelerator pedal module to generate a haptic signal in a response that an accelerator pedal pad is pivoted by operation force applied thereto by a driver;

a brake pedal haptic motor coupled to the brake pedal module to generate a haptic signal in a response that a brake pedal pad is pivoted by operation force applied thereto by the driver; and a printed circuit board (PCB) mounted in the pedal housing to cause the accelerator pedal haptic motor and the brake pedal haptic motor to generate haptic signals upon receiving signals from the accelerator pedal detecting unit and the brake pedal detecting unit, wherein the accelerator pedal haptic motor and the brake pedal haptic motor are controlled by the PCB to generate different types of haptic signals or haptic signals including different intensities from each other.

20. An electronic pedal apparatus comprising:

an accelerator pedal module including an accelerator pedal pad;

a brake pedal module including a brake pedal pad;

a pedal housing to which the accelerator pedal module and the brake pedal module are pivotably mounted while being spaced from each other in a leftward-rightward direction thereof;

an accelerator pedal detecting unit mounted in the pedal housing and the accelerator pedal module to detect pivotal movement of the accelerator pedal module;

a brake pedal detecting unit mounted in the pedal housing and the brake pedal module to detect pivotal movement of the brake pedal module; and a printed circuit board (PCB) mounted in the pedal housing to generate signals related to pedal functions of a vehicle upon receiving signals from the accelerator pedal detecting unit and the brake pedal detecting unit, wherein at least one of the accelerator pedal detecting unit and the brake pedal detecting unit includes:

a pedal magnet provided in the accelerator pedal module and the brake pedal module;

a pedal Hall sensor mounted in the pedal housing to face the pedal magnet to detect a change in magnetic flux in response to change in position of the pedal magnet due to the pivotal movement of the pedal pad; and a pedal pressure sensor fixedly mounted in the pedal housing to be in contact with a lower end portion of a pedal return spring to detect a pressure in a response that the pedal return spring is compressed by the pivotal movement of the pedal pad caused by operation force applied thereto by a driver.

* * * * *